(12) United States Patent
Hyakumura (10) Patent No.: US 11,065,722 B2
(45) Date of Patent: Jul. 20, 2021

(54) LASER PROCESSING APPARATUS AND LASER PROCESSING METHOD

(71) Applicant: Tokyo Seimitsu Co., Ltd., Tokyo (JP)

(72) Inventor: Kazushi Hyakumura, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 16/596,384

(22) Filed: Oct. 8, 2019

(65) Prior Publication Data

US 2020/0114473 A1 Apr. 16, 2020

(30) Foreign Application Priority Data

Oct. 10, 2018 (JP) .............................. JP2018-192092

(51) Int. Cl.
*B23K 26/53* (2014.01)
*G02B 19/00* (2006.01)
(Continued)

(52) U.S. Cl.
CPC .......... *B23K 26/53* (2015.10); *B23K 26/0608* (2013.01); *B23K 26/0643* (2013.01);
(Continued)

(58) Field of Classification Search
CPC ................ B23K 26/53; B23K 26/0608; B23K 26/0643; B23K 26/0648; B23K 26/0652;
(Continued)

(56) References Cited

U.S. PATENT DOCUMENTS

2013/0271810 A1 10/2013 Yokoi et al.
2016/0052084 A1 2/2016 Kawaguchi et al.
(Continued)

FOREIGN PATENT DOCUMENTS

JP 2010-260063 A 11/2010
JP 2011-051011 A 3/2011
(Continued)

OTHER PUBLICATIONS

Tokyo Seimitsu Co., Ltd, Decision to Grant a Patent, Patent App. No. JP 2018-192092, dated Aug. 15, 2019, 6 pgs.
(Continued)

*Primary Examiner* — Galen H Hauth
(74) *Attorney, Agent, or Firm* — Morgan, Lewis & Bockius LLP (57) ABSTRACT

A laser processing apparatus includes: a light flux separating-and-combining device configured to polarize and separate a laser light into two polarized light fluxes having polarization orthogonal to each other and emit the two light fluxes with their optical paths matching each other toward different regions of a spatial light modulator, and configured to combine the two polarized light fluxes modulated by the spatial light modulator and emit the two light fluxes toward a condenser lens; and a controller configured to control hologram patterns presented by the spatial light modulator for respective regions of the spatial light modulator irradiated with the two polarized light fluxes such that the laser light is condensed by the condenser lens at two positions different from each other in a thickness direction inside of the wafer and the same as each other in a relative movement direction of the laser light to form modified regions.

10 Claims, 8 Drawing Sheets

(51) Int. Cl.
  *G02F 1/1362* (2006.01)
  *B23K 26/06* (2014.01)
  *B23K 26/067* (2006.01)
  *B23K 26/08* (2014.01)
  *G02B 27/28* (2006.01)
  *H01L 21/78* (2006.01)
  *H01L 21/67* (2006.01)
  *H01L 21/268* (2006.01)

(52) U.S. Cl.
  CPC ...... *B23K 26/0648* (2013.01); *B23K 26/0652* (2013.01); *B23K 26/0665* (2013.01); *B23K 26/0673* (2013.01); *B23K 26/0869* (2013.01); *G02B 19/009* (2013.01); *G02B 19/0009* (2013.01); *G02B 27/283* (2013.01); *G02F 1/136277* (2013.01); *G02F 2203/02* (2013.01); *G02F 2203/12* (2013.01); *H01L 21/268* (2013.01); *H01L 21/67115* (2013.01); *H01L 21/78* (2013.01)

(58) Field of Classification Search
  CPC ............ B23K 26/0673; B23K 26/0665; B23K 26/0869; B23K 26/0617; B23K 26/0676; G02B 19/0009; G02B 19/009; G02F 1/136277

See application file for complete search history.

(56) References Cited

U.S. PATENT DOCUMENTS

2016/0052085 A1* 2/2016 Kawaguchi ............ B23K 26/53
                                                219/121.68
2017/0261760 A1* 9/2017 Takiguchi ................. G02F 1/13

FOREIGN PATENT DOCUMENTS

| JP | 2012-016722 A | 1/2012 |
| JP | 2013-221953 A | 10/2013 |
| JP | 2016-051147 A | 4/2016 |
| WO | WO 2014/156690 A1 | 10/2014 |

OTHER PUBLICATIONS

Notification for Reasons for Refusal, JP Patent App. No. 2019-167034, dated Sep. 30, 2019, 7 pgs.

* cited by examiner

LASER PROCESSING APPARATUS AND LASER PROCESSING METHOD

CROSS-REFERENCE TO RELATED APPLICATIONS

The present application claims priority under 35 U.S.C. § 119 to Japanese Patent Application No. 2018-192092, filed on Oct. 10, 2018. The above application is hereby expressly incorporated by reference, in its entirety, into the present application.

BACKGROUND OF THE INVENTION

Field of the Invention

The present disclosure relates to a laser processing apparatus and a laser processing method which emit a laser light whose condensing point set inside of a workpiece to form modified regions inside of the workpiece along a planned cutting line of the workpiece.

Description of the Related Art

Conventionally, a laser processing apparatus which emits a laser light whose condensing point set inside of a workpiece to form modified regions inside of the workpiece along a planned cutting line of the workpiece, has been known (for example, see Japanese Patent Application Laid-Open No. 2011-051011).

In the laser processing apparatus disclosed in Japanese Patent Application Laid-Open No. 2011-051011, when the workpiece is irradiated with a laser light while relatively moved along the planned cutting line, the laser light is simultaneously condensed at two positions which are mutually different in a thickness direction in the workpiece and separated along a relative movement direction of the laser light, so as to simultaneously form a pair of modified regions. Thus, one scanning can form two lines of modified regions inside of the workpiece along one planned cutting line.

CITATION LIST

Patent Literature: Japanese Patent Application Laid-Open No. 2011-051011

SUMMARY OF THE INVENTION

However, in the laser processing apparatus disclosed in Japanese Patent Application Laid-Open No. 2011-51011, as described above, when the pair of modified regions are simultaneously formed, the laser light is simultaneously condensed at two positions which are mutually different in the thickness direction in the workpiece and separated along the relative movement direction of the laser light. Therefore, two modified regions arranged in the thickness direction are formed in the workpiece at mutually different timings. Accordingly, there has been a problem that cracks running from the two modified regions arranged in the thickness direction are difficult to be connected to each other, which leads to poor cutting accuracy of the workpiece.

The present disclosure is made considering such circumstances, and an object of the present disclosure is to provide a laser processing apparatus and a laser processing method which can cut a workpiece along a planned cutting line with high accuracy.

To achieve the object, the following inventions are provided.

According to a first aspect of the present disclosure, there is provided a laser processing apparatus which emits a laser light with a light condensing point set inside of a workpiece to form modified regions inside of the workpiece along a planned cutting line of the workpiece, the laser processing apparatus including: a laser light source configured to emit the laser light; a spatial light modulator configured to modulate the laser light; a condenser lens configured to condense the laser light inside of the workpiece; a relative driver configured to move the laser light relatively to the workpiece along the planned cutting line; a light flux separating and combining device configured to polarize and separate the laser light emitted from the laser light source into two polarized light fluxes having polarization directions orthogonal to each other and emit the two polarized light fluxes toward different regions of the spatial light modulator in a state where the two polarized light fluxes have polarization directions matching each other, and configured to combine the two polarized light fluxes modulated by the spatial light modulator and emit the combined light fluxes toward the condenser lens; and a controller configured to control hologram patterns to be presented by the spatial light modulator for respective regions of the spatial light modulator toward which the two polarized light fluxes are emitted so as to condense the laser light by the condenser lens at two positions which are different from each other in a thickness direction of the workpiece inside of the workpiece and are the same as each other in a relative movement direction of the laser light, and form the modified regions.

According to a second aspect of the present disclosure, in the laser processing apparatus according to the first aspect, the light flux separating and combining device includes: a polarization beam splitter configured to polarize and separate the laser light emitted from the laser light source into two polarized light fluxes having polarization directions orthogonal to each other; a total reflecting prism or mirror configured to reflect one polarized light flux of the two polarized light fluxes polarized and separated by the polarization beam splitter so as to have an optical path parallel to an optical path of another polarized light flux of the two polarized light fluxes; and a λ/2 wave plate arranged between the total reflecting prism or mirror and the spatial light modulator, and configured to convert a polarization direction of the one polarized light flux reflected by the total reflecting prism or mirror into a polarization direction of the another polarized light flux and emit the one polarized light flux.

According to a third aspect of the present disclosure, in the laser processing apparatus according to the first aspect or the second aspect, the light flux separating and combining device further includes an optical-path-length correcting optical system configured to reduce a difference in geometric optical path length between the two polarized light fluxes.

According to a fourth aspect of the present disclosure, there is provided a laser processing method which emits a laser light with a light condensing point set inside of a workpiece to form modified regions inside of the workpiece along a planned cutting line of the workpiece, the laser processing method including: a modulation step of modulating the laser light emitted from a laser light source; a light condensing step of condensing the laser light modulated by a spatial light modulator, inside of the workpiece by a condenser lens; a relative moving step of moving the laser light relatively to the workpiece along the planned cutting line; a control step of performing control so that the laser light is condensed by the condenser lens at two positions which are different from each other in a thickness direction of the workpiece inside of the workpiece and are the same as each other in a relative movement direction of the laser light, to form the modified regions; and a light flux separating and combining step of polarizing and separating the laser light emitted from the laser light source into two polarized light fluxes having polarization directions orthogonal to each other to emit the two polarized light fluxes toward different regions of the spatial light modulator in a state where the two light fluxes have polarization directions matching each other, and combining the two polarized light fluxes modulated by the spatial light modulator to emit the combined light fluxes toward the condenser lens, wherein in the control step, hologram patterns to be presented by the spatial light modulator is controlled for respective regions of the spatial light modulator toward which the two polarized light fluxes are emitted.

According to a fifth aspect of the present disclosure, in the laser processing method according to the fourth aspect, the light flux separating and combining step includes: a polarization separation step of polarizing and separating the laser light emitted from the laser light source into two polarized light fluxes having polarization directions orthogonal to each other; a reflecting step of reflecting one polarized light flux of the two polarized light fluxes polarized and separated in the polarization separation step so as to have an optical path parallel to an optical path of another polarized light flux of the two polarized light fluxes; a conversion step of converting a polarization direction of the one polarized light flux reflected in the reflecting step into a polarization direction of the another polarized light flux; and an emitting step of emitting the one polarized light flux having the polarization direction converted in the converting step and the another polarized light flux toward the spatial light modulator.

According to a sixth aspect of the present disclosure, in the laser processing method according to the fourth aspect or the fifth aspect, the light flux separating and combining step further includes an optical path length correction step of reducing a difference in geometric optical path length between the two polarized light fluxes.

According to the present disclosure, a workpiece can be cut along a planned cutting line with high accuracy.

DETAILED DESCRIPTION OF THE PREFERRED EMBODIMENTS

Hereinafter, embodiments of the present disclosure are explained in detail with reference to attached drawings.

Figure 1:
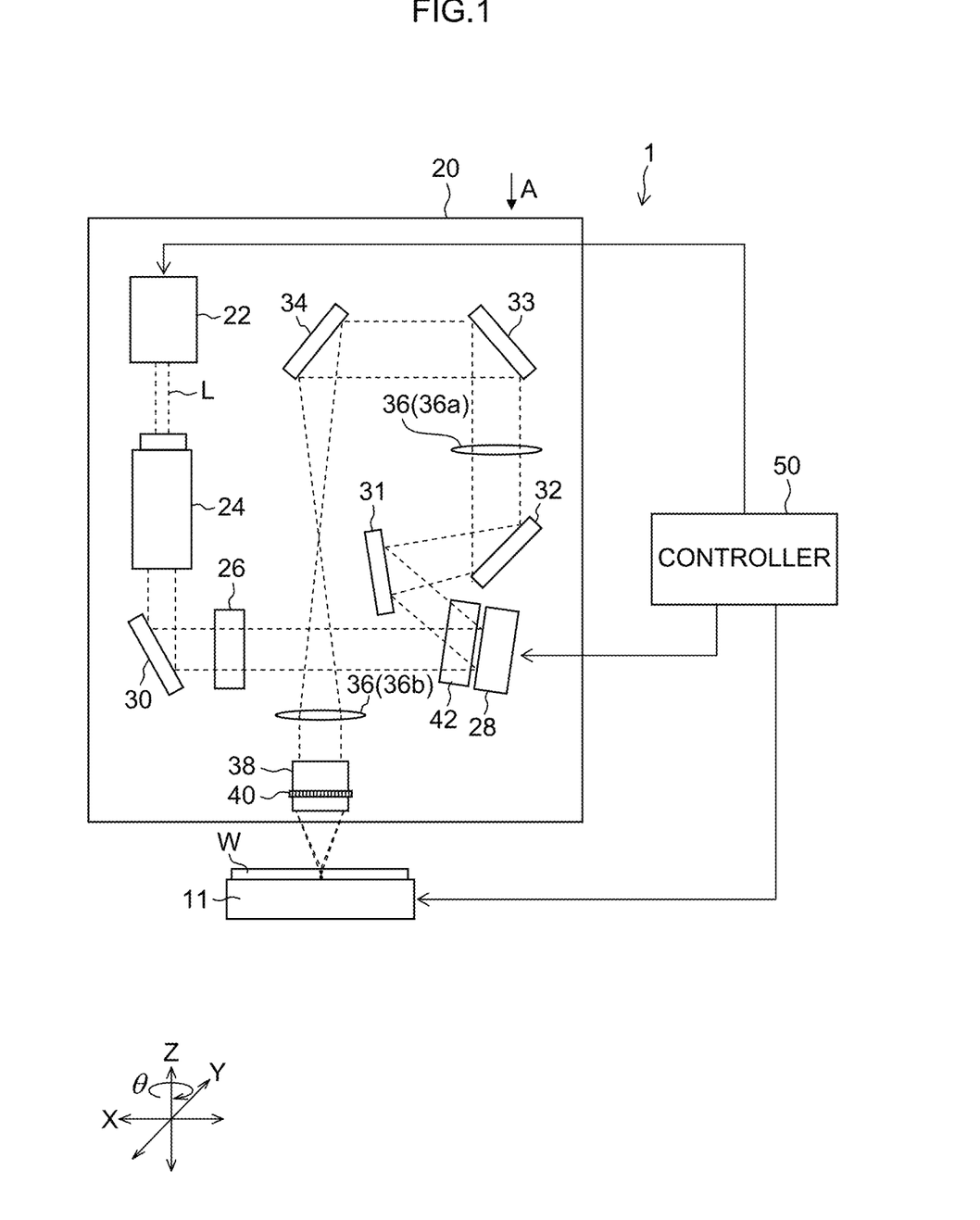
FIG. 1 is a schematic configuration diagram of a laser processing apparatus according to one embodiment of the present disclosure.

FIG. 1 is a schematic configuration diagram of a laser processing apparatus according to one embodiment of the present disclosure. As shown in FIG. 1, a laser processing apparatus 1 according to this embodiment includes a stage 11, a laser engine (an optical system unit) 20 and a controller (control unit) 50. Additionally, while a case where the laser engine 20 and the controller 50 are separately configured is exemplified in this embodiment, the configuration is not limited to this example. The laser engine 20 may include a part or the entire of the controller 50.

The stage 11 sucks and holds a workpiece. The stage 11 includes a not shown stage moving mechanism and is configured to be movable in X, Y, Z, θ directions by the stage moving mechanism. The stage moving mechanism can be configured by various mechanisms such as a ball screw mechanism and a linear motor mechanism. Additionally, in FIG. 1, three directions of X, Y and Z are orthogonal to each other, and in these directions, the X direction and Y direction are horizontal directions, and the Z direction is a vertical direction. Also, the θ direction is a rotation direction around a vertical axis (the Z direction) as a rotation axis. The stage 11 is one example of a relative moving device (relative driver) according to the present disclosure.

In this embodiment, a semiconductor wafer W such as a silicon wafer (hereinafter, it is referred to as "a wafer") is applied as a workpiece. The wafer W is divided into a plurality of regions by planned cutting lines arranged to form a lattice, and various devices constituting a semiconductor chip are formed in each of the divided regions. Here, while a case where the wafer W is applied as the workpiece is explained in this embodiment, the present disclosure is not limited to this. For example, a glass substrate, a piezoelectric ceramic substrate and a glass substrate may be applied as the workpiece.

On a front surface (device surface) of the wafer W, devices are formed, and a back grinding tape (hereinafter, it is referred to as a BG tape) having an adhesive compound is attached to the front surface of the wafer W. The wafer W is placed on the stage 11 such that a rear surface of the Wafer faces upward. Although the thickness of the wafer W is not limited, it is typically 700 μm or more, and more typically, 700 to 800 μm.

Here, alternatively, a dicing tape having an adhesive compound may be attached to one surface of the wafer W so that the wafer W may be placed on the stage 11 in a state where the wafer W is integrated a frame via the dicing tape.

The laser engine 20 includes a laser light source 22, a spatial light modulator 28 and a condenser lens 38 and so on.

The laser light source (an IR (Infrared Ray) laser light source) 22 emits a processing laser light L for forming a modified region inside of the wafer W in accordance with control by the controller 50. For example, the conditions and specification of the laser light L are: a light source is a semiconductor laser excitation Nd: YAG laser (YAG: Yttrium Aluminum Garnet); a wavelength is 1.1 μm; a cross-sectional area of a laser light spot is $3.14 \times 10^{-8}$ cm$^2$; an oscillation form is Q switch pulse; a repetition frequency is 80 to 200 kHz; a pulse width is 180 to 370 ns; and an output is 8 W.

The spatial light modulator 28 is a phase-modulation-type modulator. The spatial light modulator 28 receives the laser light L emitted from the laser light source 22 and presents a predetermined hologram pattern for modulating a phase of the laser light L in each of a plurality of pixels in a two-dimensional array, and emits the laser light L having been phase-modulated. Thereby, as described in detail later, when the wafer W is relatively moved along the planned cutting line while being irradiated with the laser light L, the laser light L is simultaneously condensed at two positions which are mutually different in a thickness direction inside of the wafer W and mutually the same in the relative movement direction of the laser light L.

As the spatial light modulator 28, for example, a reflective liquid crystal type (LCOS: liquid crystal on silicon) spatial light modulator (SLM) is used. The controller 50 controls an operation of the spatial light modulator 28 and a hologram pattern to be presented by the spatial light modulator 28. Here, since a concrete configuration of the spatial light modulator 28 has already been well-known, a detailed explanation thereof is omitted.

Figure 2:
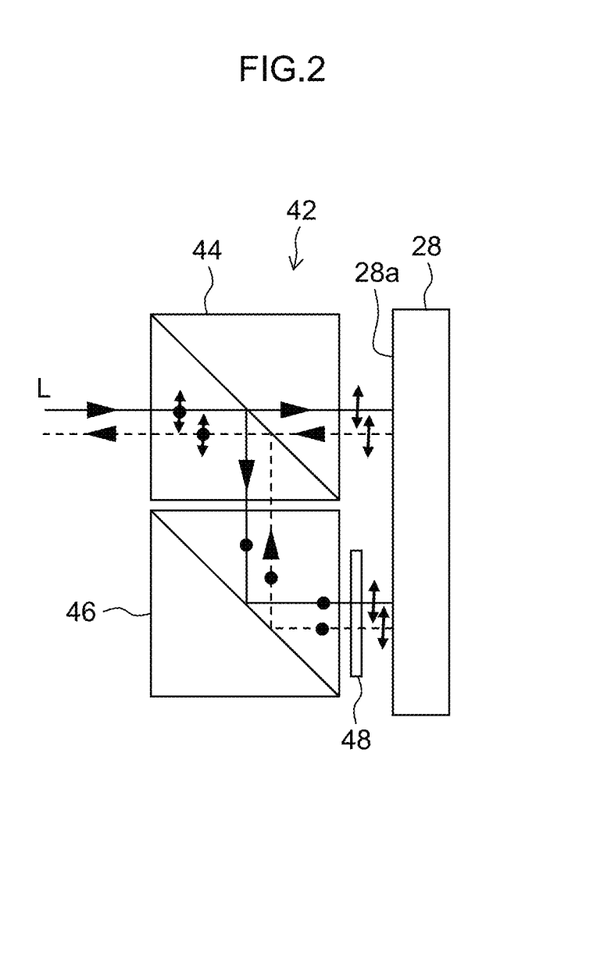
FIG. 2 shows a configuration of a spatial light modulator and its surroundings, seen from the same direction as in FIG. 1.
Figure 3:
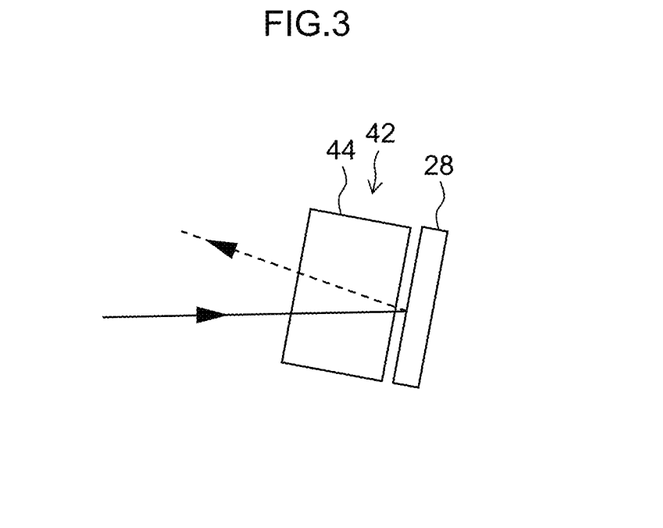
FIG. 3 shows a configuration of the spatial light modulator and its surroundings, seen from an arrow A in FIG. 1.
Figure 4:
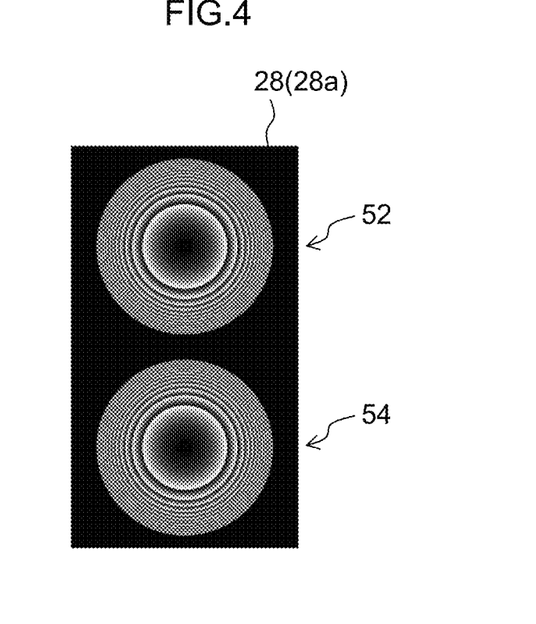
FIG. 4 shows one example of a hologram pattern presented by the spatial light modulator.

FIGS. 2 and 3 show a configuration of the spatial light modulator 28 and its surroundings, and FIG. 2 is a drawing seen from the same direction as in FIG. 1 and FIG. 3 is a drawing seen from a direction of an arrow A of FIG. 1. Moreover, FIG. 4 shows one example of the hologram pattern presented by the spatial light modulator 28.

As shown in FIGS. 2 and 3, in this embodiment, a light flux separating and combining device 42 is placed in front of the spatial light modulator 28. The light flux separating and combining device 42 polarizes and separates the laser light L emitted from the laser light source 22 into two polarized light fluxes so that the two polarized light fluxes have polarization directions orthogonal to each other, and then emits the two polarized light fluxes toward the spatial light modulator 28. In addition, the light flux separating and combining device 42 combines the two polarized light fluxes modulated by the spatial light modulator 28 and emits the combined light flux toward the same direction. In addition, the light flux separating and combining device 42 guides the two polarized light fluxes to the spatial light modulator 28 in a state where the two polarized light fluxes to be emitted to the spatial light modulator 28 have optical paths parallel to each other and polarization directions matching each other.

In more detail, the light flux separating and combining device 42 includes a polarization beam splitter 44, a total reflecting prism or mirror 46, and a λ/2 wave plate 48.

The polarization beam splitter 44 polarizes and separates the laser light L from the laser light source 22, into two polarized light fluxes having polarization directions orthogonal to each other (a first polarized light flux and a second polarized light flux). In the polarization beam splitter 44 according to this embodiment, as one example, the first polarized light flux (P polarized light flux) is transmitted and the second polarized light flux (S polarized light flux) is reflected. Here, the first polarized light flux corresponds to "the other polarized light flux" of the present disclosure and the second polarized light flux corresponds to "one polarized light flux" of the present disclosure.

The first polarized light flux (P polarized light flux) having passed through the polarization beam splitter 44 is emitted toward the spatial light modulator 28 without changing its traveling direction.

The second polarized light flux (S polarized light flux) reflected by the polarization beam splitter 44 changes its traveling direction by 90°, and then is emitted toward the total reflecting prism or mirror 46. Moreover, the second polarized light flux (S polarized light flux) is further reflected by the total reflecting prism or mirror 46, changes its traveling direction by 90°, and is emitted toward the λ/2 wave plate 48 in a state where the second polarized light flux has optical path parallel to the optical path of the first polarized light flux (P polarized light flux).

When the second polarized light flux (S polarized light flux) reflected by the total reflecting prism or mirror 46 enters the λ/2 wave plate 48, the phase of the second polarized light flux is shifted by 180° so that the second polarized light flux is converted into a P polarized light flux having the same polarization direction as in the first polarized light flux (P polarized light flux), and then emitted from the λ/2 wave plate 48 toward the spatial light modulator 28.

In this way, in this embodiment, after the laser light L from the laser light source 22 is polarized and separated into two polarized light fluxes having polarization directions orthogonal to each other (the first polarized light flux and the second polarized light flux) by the polarization beam splitter 44, the two polarized light fluxes are guided to the spatial light modulator 28 by the total reflecting prism or mirror 46 and the λ/2 wave plate 48 in a state that the two polarized light fluxes have optical paths parallel to each other and polarization directions matching each other. Thereby, the two polarized light fluxes guided by the spatial light modulator 28 enter two regions different from each other on a modulation surface 28a of the spatial light modulator 28. Thus, as shown in FIG. 4, different hologram patterns 52, 54 can be independently set to respective regions of the modulation surface 28a of the spatial light modulator 28 (to respective irradiation regions of two polarized light fluxes).

Here, the first hologram pattern 52 shown at an upper part in FIG. 4 is a modulation pattern for modulating a phase of the first polarized light flux which is polarized and separated by the polarization beam splitter 44. The first hologram pattern 52 is made by overlapping a light-condensing hologram pattern which differentiate a light condensing position of the first polarized light flux of the laser light L condensed by the condenser lens 38 from a light condensing position of the second polarized light flux in the thickness direction of the wafer W, with a correcting hologram pattern for correcting aberration of the laser light L generated inside of the wafer W. Also, the second hologram pattern 54 shown in a lower part in FIG. 4 is a modulation pattern for modulating a phase of the second polarized light flux which is polarized and separated by the polarization beam splitter 44, and is a correcting hologram pattern for correcting aberration of the laser light L generated inside of the wafer W. Here, the first hologram pattern 52 and the second hologram pattern 54 may be opposite. Also, the second hologram pattern 54 may be made by overlapping the light-condensing hologram pattern with the correcting hologram pattern in the same manner as the first hologram pattern 52. Moreover, the correcting hologram pattern may include a pattern for correcting aberration generated by an optical system of the laser engine 20.

After the first polarized light flux (the P polarized light flux) entered the spatial light modulator 28 is modulated by the first hologram pattern 52 presented by the spatial light modulator 28, the first polarized light flux returns to the polarization beam splitter 44 via the reverse optical path, passes through the polarization beam splitter 44, and is emitted toward the condenser lens 38 (more specifically, a second mirror 31).

After the second polarized light flux in which a polarization direction is converted from the S polarized light flux to the P polarized light flux by the λ/2 wave plate 48 enters the spatial light modulator 28, the second polarized light flux is modulated by the second hologram pattern 54 presented by the spatial light modulator 28, returns to the S polarized light flux via the λ/2 wave plate 48 and is reflected by the total reflecting prism or mirror 46. After that, the second polarized light flux changes its traveling direction by 90° to return to the polarization beam splitter 44, is further reflected by the polarization beam splitter 44, combined with the first polarized light flux, and then emitted in the same direction as an emission direction of the first polarized light flux.

The condenser lens 38 is an objective lens (an infrared objective lens) to condense the laser light L inside of the wafer W. The numerical aperture (NA) of this condenser lens 38 is 0.65, for example.

The condenser lens 38 includes a correction collar 40 to correct aberration of the laser light L generated inside of the wafer W. This correction collar 40 is configured to be freely rotatable manually. When the correction collar 40 is rotated in a predetermined direction, intervals of lenses constituting the condenser lens 38 are changed, such that aberration of the laser light L can be corrected to a predetermined aberration amount or less at a predetermined depth from a laser light irradiation surface (the rear surface) of the wafer W.

Here, the correction collar 40 may be configured to be electrically rotated by a not-shown correction collar driving unit. In this case, the controller 50 controls an operation of the correction collar driving unit such that aberration of the laser light L is in a desired state by rotating the correction collar 40.

In addition to the above configurations, the laser engine 20 includes a beam expander 24, a λ/2 wave plate 26 and a reduction optical system 36 and so on.

The beam expander 24 expands the laser light L emitted from the laser light source 22 to have a beam diameter suitable for the spatial light modulator 28. The λ/2 wave plate 26 adjusts a polarization surface from which the laser light is incident to the spatial light modulator 28. The reduction optical system 36 is an afocal optical system (a both-side telecentric optical system), and includes a first lens 36a and a second lens 36b. The reduction optical system 36 reduces and projects the laser light L modulated by the spatial light modulator 28, to the condenser lens 38.

Also, although illustration is omitted, the laser engine 20 includes an alignment optical system that executes alignment with the wafer W and an auto focus unit which keeps the distance between the wafer W and the condenser lens 38 (a working distance) constant and so on.

The controller 50 is a control apparatus that controls an operation of each unit of the laser processing apparatus 1. The controller 50 includes a CPU (central processing unit) which functions as a controller that executes various processing, a RAM (random access memory) which functions as a memory that stores various information and ROM (read only memory) etc. The controller 50 executes control of an operation for forming a modified region inside of the wafer W by controlling an operation of each unit of the laser processing apparatus 1 (the stage 11 or the laser engine 20 etc.) based on processing information (a processing condition etc.) designated by an operator.

Also, the controller 50 controls an operation of the spatial light modulator 28 and allows the spatial light modulator 28 to present a predetermined hologram pattern. Here, in this embodiment, by the light flux separating and combining device 42, the laser light L from the laser light source 22 is polarized and separated into two polarized light fluxes (the first polarized light flux and the second polarized light flux) which have polarization directions orthogonal to each other, and the two polarized light fluxes enter the spatial light modulator 28 in a state that the two polarized light fluxes have optical paths parallel to each other and polarization directions matching each other. Therefore, the controller 50 is configured to independently set different hologram patterns for respective irradiation regions of two polarized light fluxes entering the spatial light modulator 28. More concretely, the controller 50 allows the spatial light modulator 28 to present hologram patterns (the first hologram pattern 52 and the second hologram pattern 54) for modulating the laser light L for respective irradiation regions of the two polarized light fluxes so that the laser light L is simultaneously condensed by condenser lens 38 at two positions (a first light condensing position and a second light condensing position) which are different from each other in the thickness direction inside of the wafer W and are the same as each other in a relative movement direction of the laser light L. Additionally, the hologram patterns are previously derived based on a forming position of the modified region, a wavelength of the laser light L for irradiation and a refractive index of the condenser lens 38, the wafer W and so on, and stored in the controller 50.

In addition, the laser processing apparatus 1 includes a wafer conveying device, a control panel, a television monitor, an indicator light and so on, which are not shown.

To the control panel, a switch and the like and a display unit are attached in order to control operations of each unit of the laser processing apparatus 1. The television monitor displays a wafer image imaged by a not shown CCD camera, or displays contents of a program, various messages etc. The indicator light displays an operation status such as under processing, completion of processing and an emergency stop of the laser processing apparatus 1.

Next, a laser processing method according to one embodiment of the present disclosure is explained. This laser processing method is performed using the laser processing apparatus 1 according to this embodiment.

First, the correction collar 40 provided to the condenser lens 38 is manually (or electrically) rotated to adjust an aberration correction amount the laser light L to be a predetermined aberration or less, at a condensing position (a working depth of the modified region) of the laser light L inside of the wafer W. Additionally, in the present specification, "an aberration correction amount" is a value converted to a depth from the laser light irradiation surface (a rear surface) of the wafer W. In other words, in a case where the aberration correction amount is, for example, 500 μm, it means that aberration of the laser light becomes minimum near a position where a depth from the laser light irradiation surface of the wafer W is 500 μm. For example, in a case where the wafer W has a thickness (an initial thickness) of 775 μm, the aberration correction amount is preferably set to 500 μm by the correction collar 40.

In this way, using the correction collar 40 of the condenser lens 38, aberration is corrected to a predetermined aberration amount or less at a position where a light condensing point of the laser light L is matched. Therefore, even if the thickness of the wafer W is large, the laser light L can be efficiently condensed at a deep position in the thickness direction of the wafer W. Here, the reason why aberration correction using the correction collar 40 is effective and another aberration correction device are described in Japanese Patent Application Laid-Open No. 2016-11315 filed by the applicant of the present application in detail, and an explanation thereof is omitted here.

Additionally, while aberration is corrected using correction collar 40 in this embodiment, this is not at all restrictive. For example, aberration is not necessarily corrected using the correction collar 40. In this case, the aberration may be corrected using the spatial light modulator 28.

Next, the wafer W to be processed is placed on the stage 11, and then, alignment of the wafer W is performed using the not shown alignment optical system.

Next, the laser light L is moved relatively to the wafer W along the planned cutting line, while the wafer W is irradiated with the laser light L. Here, the laser light L is relatively moved by performing working feed of the stage 11 which sucks and holds the wafer W in the X direction.

At this time, the laser light L emitted from the laser light source 22 has an enlarged beam diameter by the beam expander 24 and is reflected by the first mirror 30. Moreover, the polarization direction of the laser light L is changed by the λ/2 wave plate 26, and then, the laser light L enters the spatial light modulator 28 via the light flux separating and combining device 42.

In the light flux separating and combining device 42, the laser light L from the laser light source 22 is polarized and separated into two polarized light fluxes having polarization directions orthogonal to each other (the first polarized light flux and the second polarized light flux), and the two polarized light fluxes enter the spatial light modulator 28 in a state that the two polarized light fluxes have optical paths parallel to each other and polarization directions matching each other.

The two polarized light fluxes of the laser light L entered the spatial light modulator 28 are modulated in accordance with predetermined hologram patterns presented by the spatial light modulator 28 (the first hologram pattern 52 and the second hologram pattern 54). In this case, the controller 50 controls the spatial light modulator 28 to present the hologram patterns for modulating the laser light L for respective irradiation regions of the two polarized light fluxes so that the laser light L is simultaneously condensed by the condenser lens 38 at two positions which are different from each other in the thickness direction inside of the wafer W and are the same as each other in a relative movement direction M of the laser light L (see FIG. 5).

The two polarized light fluxes modulated and emitted by the spatial light modulator 28 are combined by the light flux separating and combining device 42 and emitted toward the same direction. At this time, the two polarized light fluxes emitted from the light flux separating and combining device 42 (the polarization beam splitter 44) have polarization directions which are orthogonal to each other.

In this way, after the laser light L (two polarized light fluxes) emitted from the spatial light modulator 28 via the light flux separating and combining device 42 is sequentially reflected by the second mirror 31 and a third mirror 32, passes through the first lens 36a and is further reflected by a fourth mirror 33 and a fifth mirror 34, and moreover, passes through the second lens 36b and enters the condenser lens 38. Thereby, the laser light L emitted from the spatial light modulator 28 is reduced and projected to the condenser lens 38 by the reduction optical system 36 including the first lens 36a and the second lens 36b. Moreover, the laser light L entered the condenser lens 38 is condensed at two positions inside of the wafer W which are mutually different for each polarized light flux having a different polarization direction, by the condenser lens 38.

Figure 5:
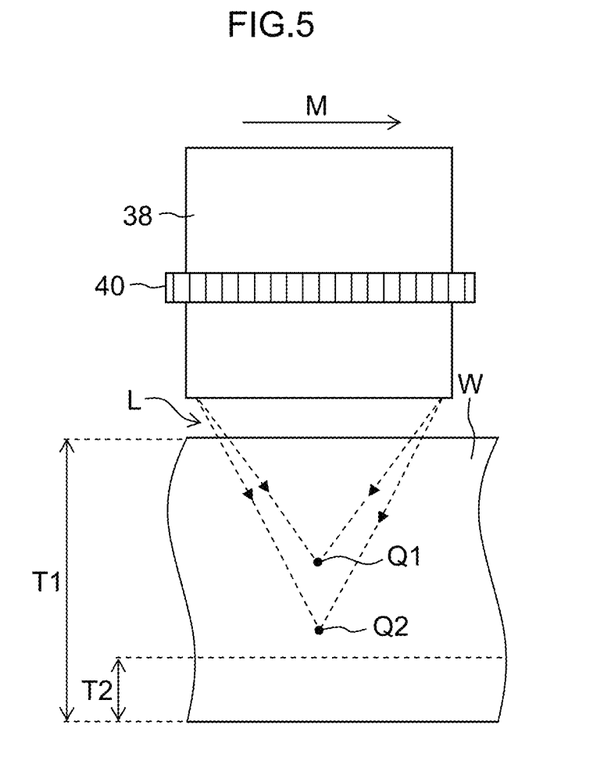
FIG. 5 is a drawing for explaining a laser processing method according to one embodiment of the present disclosure.
Figure 6:
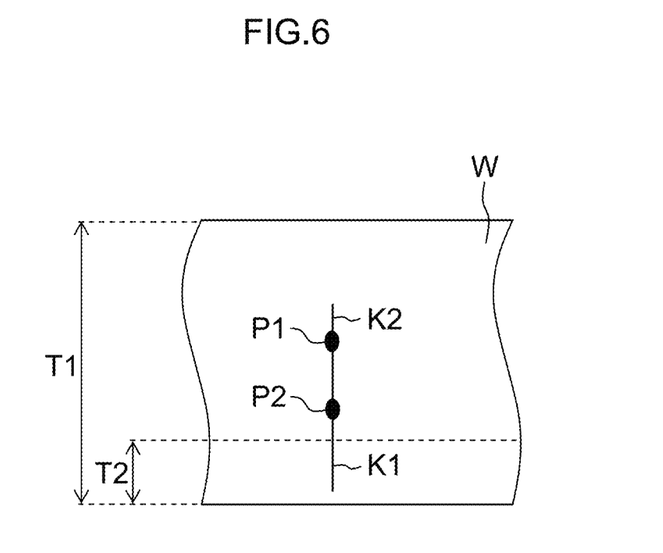
FIG. 6 is a drawing for explaining a laser processing method according to the embodiment of the present disclosure.
Figure 7:
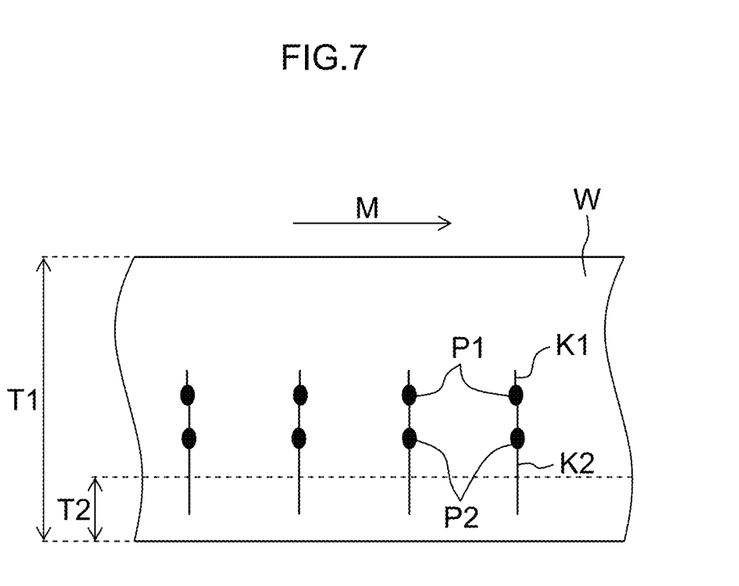
FIG. 7 is a drawing for explaining a laser processing method according to the embodiment of the present disclosure.

FIGS. 5 to 7 are drawings for explaining a laser processing method according to one embodiment of the present disclosure. Here, FIG. 5 is a drawing showing a state that the laser light L is condensed inside of the wafer W. FIG. 6 is a drawing showing a state that modified regions are formed at light condensing positions of the laser light L shown in FIG. 5. FIG. 7 is a drawing showing a state that two lines of modified regions are formed inside of the wafer W along the planned cutting line.

As shown in FIG. 5, the laser light L modulated by the spatial light modulator 28 is condensed by the condenser lens 38 simultaneously at two positions (a first light condensing position Q1, a second light condensing position Q2) which are different from each other in the thickness direction inside of the wafer W and are the same as each other in the relative movement direction M of the laser light L. Thereby, as shown in FIG. 6, a pair of modified regions P1, P2 is formed in the vicinity of the two light condensing positions Q1, Q2. Also, when the pair of modified regions P1, P2 is formed, cracks K1, K2 extending from the respective modified regions P1, P2 in the thickness direction of the wafer W are formed. Consequently, as shown in FIG. 7, when one scanning along the planned cutting line is executed, two lines of the modified regions P1, P2 can be formed inside of the wafer W. Here, for an example, the interval of two light condensing positions Q1, Q2 is set to 50 to 80 μm in the thickness direction inside of the wafer W.

In this way, when two lines of modified regions P1, P2 are formed inside of the wafer W by one scanning along the planned cutting line, the stage 11 is subjected to index feeding by one pitch in the Y direction, and the same process is performed to the next planned cutting line, whereby the corresponding modified regions P1, P2 are formed.

When the modified regions P1, P2 are formed along all the planned cutting lines which are parallel with the X direction, the stage 11 is rotated by 90°, and the same process is performed to lines which are orthogonal to the previous planned cutting lines, whereby all the modified regions P1, P2 are formed. Thus, the modified regions P1, P2 are formed along all the planned cutting lines.

After the modified regions P1, P2 are formed along the planned cutting lines as described above, using a not shown grinding device, a rear surface grinding step of grinding the rear surface of the wafer W is performed so as to reduce a thickness T1 (the initial thickness) of the wafer W to a predetermined thickness T2 (a final thickness) (for example, 30 to 50 μm).

After the rear surface grinding step, an expanding tape (the dicing tape) is attached to the rear surface of the wafer W and the BG tape attached to the front surface of the wafer W is peeled off, and then, an expanding step of applying tension to the expanding tape attached to the rear surface of the wafer W to expand the expanding tape is executed.

Thereby, the wafer W is cut starting from the cracks which reach a side of the device surface (the front surface) of the wafer W. In other words, the wafer W is cut along the planned cutting lines and is divided into a plurality of chips.

In this way, according to this embodiment, when the wafer W is relatively moved along the planned cutting line while irradiating the wafer W with the laser light L, the laser light L is simultaneously condensed by the condenser lens 38 at two light condensing positions Q1, Q2 which are different from each other in the thickness direction inside of the wafer W and are the same as each other in the relative movement direction M of the laser light L, whereby the modified regions P1, P2 are formed. Consequently, the two modified regions P1, P2 arranged (aligned) in the thickness direction inside of the wafer W are formed substantially at the same timing. Thus, when two lines of modified regions P1, P2 are formed inside of the wafer W by one scanning along the planned cutting line, cracks running from the modified regions P1, P2 formed at substantially the same timing are sequentially formed in the thickness direction of the wafer W. Accordingly, compared to a case where the modified regions P1, P2 arranged in the thickness direction are formed at different timings, the cracks generated from the modified regions P1, P2 have excellent linearity and the cracks generated inside of the wafer W can extend efficiently with high precision.

Especially in this embodiment, by the light flux separating and combining device 42, the laser light L from the laser light source 22 is polarized and separated into two polarized light fluxes having polarization directions orthogonal to each other, and the two polarized light fluxes enter the spatial light modulator 28 in a state that their optical paths are parallel to each other and their polarization directions match each other. Therefore, the two polarized light fluxes guided by the spatial light modulator 28 enter two regions different from each other on the modulation surface 28a of the spatial light modulator 28. Because this enables independently set different hologram patterns to the respective regions of the modulation surface 28a of the spatial light modulator 28 (respective irradiation regions of two polarized light fluxes), it is possible to achieve functions such as multi-focus and aberration correction effectively. Consequently, even when light fluxes of the laser light L are simultaneously condensed by the condenser lens 38, the respective light fluxes can be condensed at respective light condensing positions Q1, Q2 without mutual interference between the light fluxes and the modified regions P1, P2 can be formed efficiently.

Also, in this embodiment, of the two polarized light fluxes which have been polarized and separated by the polarization beam splitter 44, the first polarized light flux is directly guided to the spatial light modulator 28, while the second polarized light flux is guided via the total reflecting prism or mirror 46 and the $\lambda/2$ wave plate 48 to the spatial light modulator 28. Thus, a geometric optical path length is longer in the second polarized light flux than in the first polarized light flux. Accordingly, in this embodiment, a position having an average geometric optical path length of the two polarized light fluxes is preferably conjugated with the pupil position of the condenser lens 38. Thereby, it is possible to reduce influence by the difference in geometric optical path length between the two polarized light fluxes, and it is even possible to reduce the influence to a range that causes no problem practically.

Figure 8:
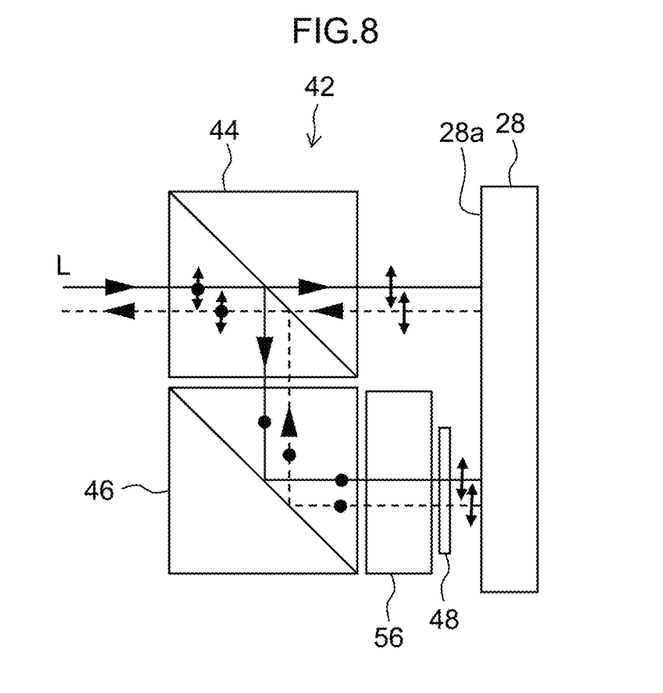
FIG. 8 shows one example of a configuration in which a light flux separating and combining device includes an optical-path-length correcting optical system.

Also, as shown in FIG. 8, in order to reduce the difference in the geometric optical path length between the two polarized light fluxes which have been polarized and separated by the polarization beam splitter 44 (ideally, to be zero), an optical-path-length correcting optical system 56 (a correction prism) is preferably placed on the optical path of the second polarized light flux. When a light advances in medium with a refractive index of n, a geometric optical path length is 1/n. Accordingly, if a refractive index of the optical-path-length correcting optical system 56 is large, a geometric optical path length becomes shorter. Therefore, the optical-path-length correcting optical system 56 is preferably configured to include glass having high refractive index (refractive index of 1.6 or more).

Also, while the light flux separating and combining device 42 is configured to include the polarization beam splitter 44 in this embodiment, the present disclosure is not limited to this configuration. The light flux separating and combining device 42 may adopt another configuration.

Figure 9:
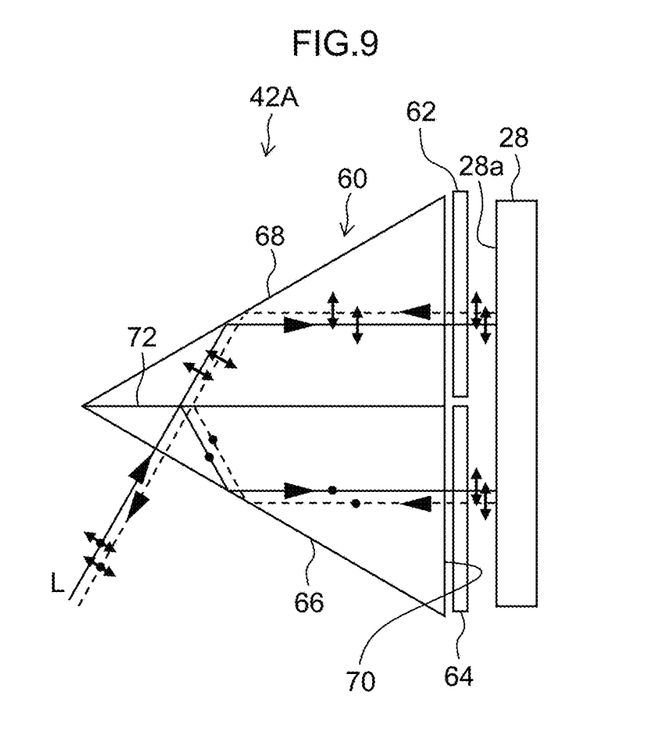
FIG. 9 shows a configuration of a light flux separating and combining device according to another configuration example.

FIG. 9 shows a configuration of a light flux separating and combining device 42A according to another configuration example. In FIG. 9, elements which are common or similar to those in FIG. 1 are applied the same reference numerals, and their explanation is omitted.

The light flux separating and combining device 42A shown in FIG. 9 includes a Kester prism 60, a parallel flat plate 62 and a $\lambda/2$ wave plate 64.

The Kester Prism 60 is a regular triangular prism with a cross section of an equilateral triangle, and includes a first surface 66, a second surface 68 and a third surface 70. The Kester prism 60 is configured by joining two regular triangular prisms. In the Kester prism 60, a polarizing film is arranged on a joint surface of these prisms, and this joint surface is configured as a polarizing surface 72.

When a laser light L from the laser light source 22 enters the first surface 66 of the Kester prism 60, the laser light L is polarized and separated into a first polarized light flux (a P polarized light flux) and a second polarized light flux (an S polarized light flux) at the polarizing surface 72. Additionally, in the polarizing surface 72 of the Kester prism 60 in this configuration example, the first polarized light flux is transmitted and the second polarized light flux is reflected.

The first polarized light flux passed through the polarizing surface 72 is reflected by the second surface 68 and then emitted from the third surface 70 toward the spatial light modulator 28. The parallel flat plate 62 for optical path adjustment is provided on the optical path of the first polarized light flux between the Kester prism 60 and the spatial light modulator 28. Thus, the first polarized light flux (the P polarized light flux) emitted from the third surface 70 enters the spatial light modulator 28 via the parallel flat plate 62.

On the other hand, the second polarized light flux reflected by the polarizing surface 72 is reflected by the first surface 66 and emitted from the third surface 70 toward the spatial light modulator 28. The $\lambda/2$ wave plate 64 is provided on the optical path of the second polarized light flux between the Kester prism 60 and the spatial light modulator 28. Thus, when the second polarized light flux (the S polarized light flux) emitted from the third surface 70 enters the $\lambda/2$ wave plate 64, the second polarized light flux is converted into the P polarized light flux having the same polarization direction as in the first polarized light flux (the P polarized light flux) and enters the spatial light modulator 28.

After the first polarized light flux and the second polarized light flux having entered the spatial light modulator 28 are modulated by the hologram patterns 52, 54 (see FIG. 4) presented for respective regions on the modulation surface 28a of the spatial light modulator 28, the first polarized light flux and the second polarized light flux travel back along the respective optical paths, and then, the first polarized light flux (the P polarized light flux) and the second polarized light flux (the S polarized light flux) are combined by the polarizing surface 72 of the Kester prism 60, and the light fluxes are emitted toward the same direction from the first surface 66. Here, an emission direction of the two light fluxes emitted from the first surface 66 is toward the condenser lens 38 (more specifically, the second mirror 31) in the same manner as the above-described embodiment.

In this way, according to the light flux separating and combining device 42A shown in FIG. 9, in the same manner as the light flux separating and combining device 42 in the above-described embodiment, the laser light L from the laser light source 22 is polarized and separated into two polarized light fluxes (the first polarized light flux and the second polarized light flux) having polarization directions orthogonal to each other, and the two polarized light fluxes are guided to the spatial light modulator 28 in a state that the two polarized light fluxes have optical path parallel to each other and polarization directions matching each other. Because the two polarized light fluxes guided to the spatial light modulator 28 enter the two regions different from each other on the modulation surface 28*a* of the spatial light modulator 28, different hologram patterns can be independently set for respective regions on the modulation surface 28*a* of the spatial light modulator 28 (respective irradiation regions of two polarized light fluxes) and functions such as multi-focus and aberration correction can be effectively achieved. As a result, the same effect as in the above-described embodiment can be obtained.

Further, according to the light flux separating and combining device 42A, by using the Kester prism 60, it is possible for the two light fluxes having been polarized and separated (the first polarized light flux and the second polarized light flux) to have optical path lengths matching (correspond to) each other. In this case, light flux images of the two polarized light fluxes emitted to the spatial light modulator 28 are in a mirror image relationship, it is required to consider such mirror image relationship in determination of the modulation patterns (hologram patterns) presented by the spatial light modulator 28.

Additionally, in this embodiment, the cracks generated inside of the wafer W preferably extend to a position not reaching the device surface of the wafer W (preferably, a position near the device surface of the wafer W). If the cracks generated inside of the wafer W extend to reach the device surface of the wafer W, since mechanical strength of the wafer W is lowered, there may be a problem in handleability (handling property), for example, the wafer W may be unintentionally cut during conveyance of the wafer W. On the other hand, when the cracks generated inside of the wafer W is prevented from reaching the device surface of the wafer W, mechanical strength of the wafer W is enhanced. This prevents the unintentional cutting of the wafer W in a case where the wafer W in which the modified regions are formed is conveyed in order to perform a subsequent process (the rear surface grinding process etc.) and so on, after the laser processing (formation of the modified region). In other words, the handleability of the wafer W can be enhanced. Moreover, by extending the cracks generated inside of the wafer W to the position near the device surface of the wafer W, it is possible to inhibit uncut regions which are not cut along the planned cutting lines from being caused in the wafer W.

Also, in this embodiment, a power ratio between the light fluxes of the laser light L which are emitted from the spatial light modulator 28 and condensed at two positions by the condenser lens 38 is preferably adjusted to a desired value. For example, the power ratio between the light fluxes can be adjusted by rotating the λ/2 wave plate 26 arranged in the front (an incident side) of the spatial light modulator 28 on the optical path of the laser light L around an optical axis. Additionally, the λ/2 wave plate 26 can be rotated manually, or the controller 50 may control a rotation angle of the λ/2 wave plate 26 by a rotation mechanism (a motor etc.) provided to the λ/2 wave plate 26. By adjusting the power ratio between the light fluxes of the laser light L, the sizes of the modified regions P1, P2 formed inside of the wafer W or the lengths of the cracks P1, P2 can be appropriately changed, which can enhance cutting accuracy of the wafer W.

Figure 10:
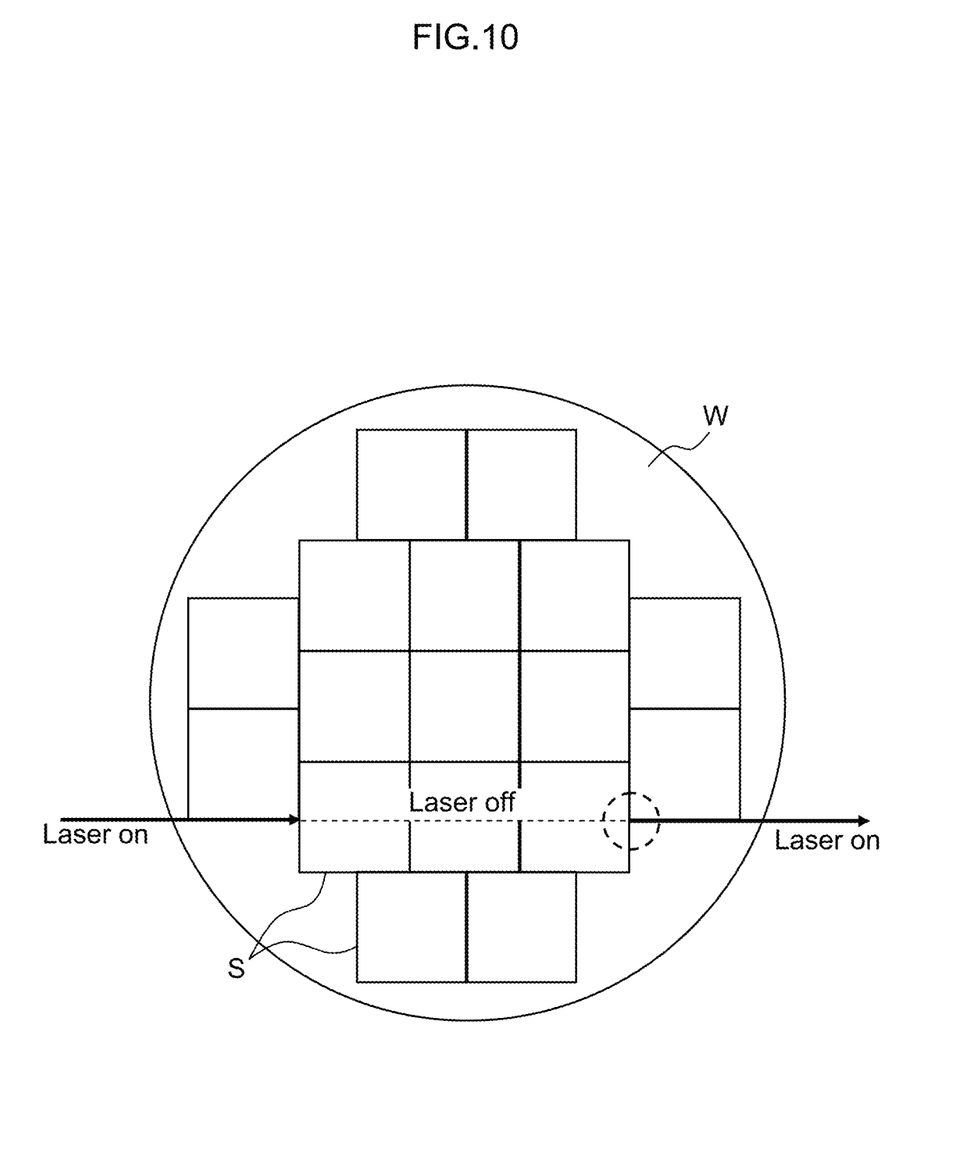
FIG. 10 is a schematic drawing showing a state that a planned cutting line having a complex shape is set to a wafer a drawing, to explain an effect of the present disclosure.

Also, in this embodiment, since the modified regions P1, P2 are formed inside of the wafer W, even when the planned cutting lines S have a complex shape as shown in FIG. 10 for example (that is, the planned cutting lines S are not continuously formed in the relative movement direction of the laser light L), as shown in FIG. 7, the pair of modified regions P1. P2 arranged in the thickness direction of the wafer W is simultaneously formed even at an irradiation start position or an irradiation completion position of the laser light L in the wafer W (for example, a portion surrounded by a dashed-line circle in FIG. 10).

Figure 11:
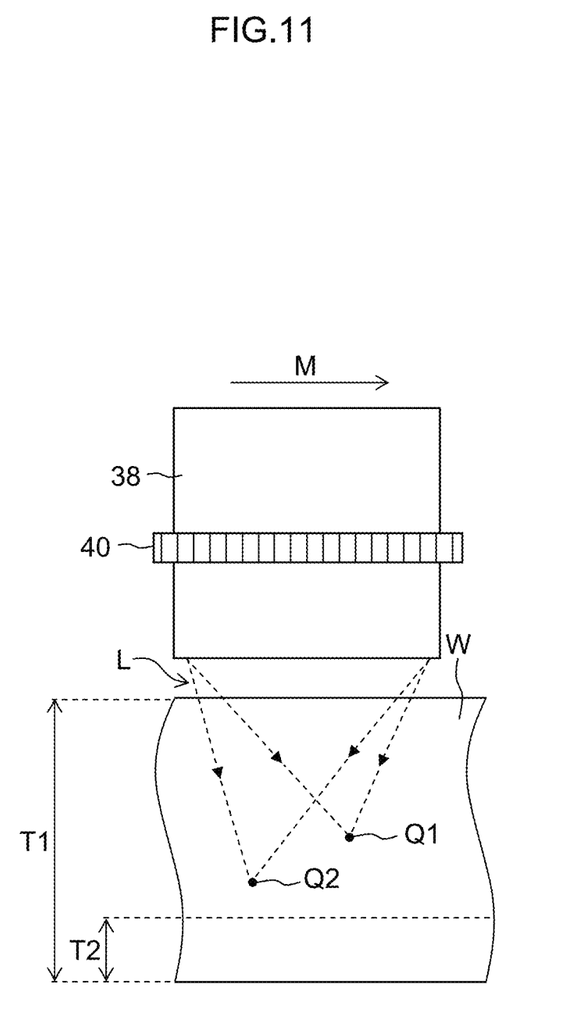
FIG. 11 is a drawing for explaining a comparative example of the present disclosure.
Figure 12:
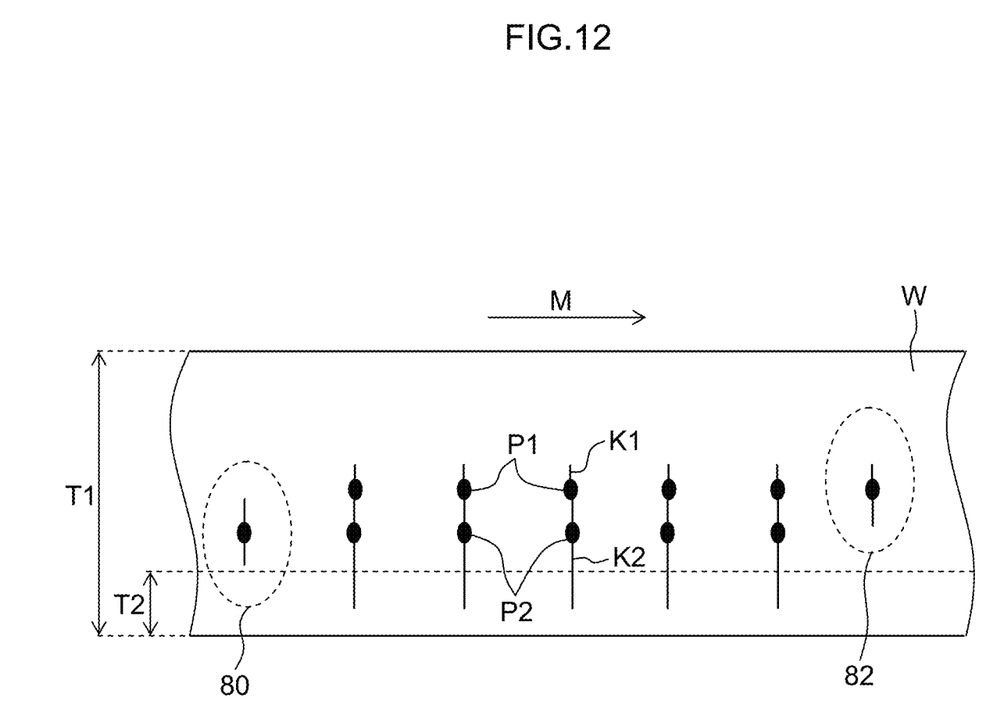
FIG. 12 is a drawing for explaining a comparative example of the present disclosure.

Here, as shown in FIG. 11 for example, in a case when the light fluxes are simultaneously condensed at two light condensing positions Q1, Q2 inside of the wafer W which are different from each other in the thickness direction of the wafer W and are separate from each other along the relative movement direction of the laser light L to simultaneously form the modified regions P1, P2, a portion where only one modified region is formed in the thickness direction of the wafer W may exist at the irradiation start position or the irradiation completion position of the laser light L, as in a region designated by reference numeral 80 or a region designated by reference numeral 82 in FIG. 12. In such a case, cutting accuracy of the wafer W may be lowered, for example, the cracks do not sufficiently extend in the thickness direction of the wafer W and meanders at the device surface of the wafer W.

On the contrary, in this embodiment, the pair of modified regions P1, P2 arranged in the thickness direction inside of the wafer W is simultaneously formed even at the irradiation start position or the irradiation completion position of the laser light L in the same manner as in other positions. Consequently, even for the wafer W with the planned cutting lines having a complex shape, the cracks can sufficiently extend in the thickness direction of the wafer W, which can enhance cutting accuracy of the wafer W.

Here, in this embodiment, explanation is made about a method which performs two-step processing for condensing the laser light L by the condenser lens 38 simultaneously at two light condensing positions Q1, Q2 which are different from each other in the thickness direction inside of the wafer W to simultaneously form the modified regions P1, P2, and then performs the rear surface grinding step of grinding the rear surface of the wafer W to divide the wafer W into each individual chip. However, a method is not limited to this method. For example, a plurality of laser processing may be performed while changing a position where the laser light L is condensed inside of the wafer W (a processing depth of the modified region), as necessity requires. In such a case, a correction pattern for correcting aberration inside of the wafer W (in this case, a pattern for cancelling correction by the correction collar 40) may be overlapped with a hologram pattern to be presented by the spatial light modulator 28 in accordance with the processing depth of the modified region, so as to appropriately correct aberration even to a portion relatively shallow from the laser light irradiation surface of the wafer W Further, while the laser light L is modulated by the spatial light modulator 28 so that the laser light L is condensed by the condenser lens 38 simultaneously at two positions which are different from each other inside of the wafer W in this embodiment, the number of positions where the laser light L is condensed is not limited to two, and the number of positions may be three or more.

Moreover, while a spatial light modulator of a reflective type is used as the spatial light modulator 28 in this embodiment, this is not restrictive. An MEMS-SLM or a DMD (a deformable mirror device) etc. may be used. Also, the spatial light modulator 28 is not limited to a reflective type, and a transmission type may be adopted. Further, as the spatial light modulator 28, a liquid crystal cell type or a LCD type etc. can be listed.

While embodiments of the present disclosure are explained as described above, this invention is not limited to the above examples, and needless to say, various modifications or variations can be executed within a scope not departing from the gist of the present disclosure.

What is claimed is:

1. A laser processing apparatus which emits a laser light with a light condensing point set inside of a workpiece to form modified regions inside of the workpiece along a planned cutting line of the workpiece, the laser processing apparatus comprising:
    a laser light source configured to emit the laser light;
    a spatial light modulator configured to modulate the laser light;
    a condenser lens configured to condense the laser light inside of the workpiece;
    a relative driver configured to move the laser light relatively to the workpiece along the planned cutting line;
    a light flux separating and combining device configured to polarize and separate the laser light emitted from the laser light source into two polarized light fluxes having polarization directions orthogonal to each other and emit the two polarized light fluxes toward different regions of the spatial light modulator in a state where the two polarized light fluxes have polarization directions matching each other, and configured to combine the two polarized light fluxes modulated by the spatial light modulator and emit the combined light fluxes toward the condenser lens; and
    a controller configured to control hologram patterns to be presented by the spatial light modulator for respective regions of the spatial light modulator toward which the two polarized light fluxes are emitted so as to condense the laser light by the condenser lens at two positions which are different from each other in a thickness direction of the workpiece inside of the workpiece and are the same as each other in a relative movement direction of the laser light, and form the modified regions, wherein
    the light flux separating and combining device further comprises an optical-path-length correcting optical system configured to reduce a difference in geometric optical path length between the two polarized light fluxes.

2. The laser processing apparatus according to claim 1, wherein
    the light flux separating and combining device comprises:
        a polarization beam splitter configured to polarize and separate the laser light emitted from the laser light source into two polarized light fluxes having polarization directions orthogonal to each other;
        a total reflecting prism or mirror configured to reflect one polarized light flux of the two polarized light fluxes polarized and separated by the polarization beam splitter so as to have an optical path parallel to an optical path of another polarized light flux of the two polarized light fluxes; and
        a λ/2 wave plate arranged between the total reflecting prism or mirror and the spatial light modulator, and configured to convert a polarization direction of the one polarized light flux reflected by the total reflecting prism or mirror into a polarization direction of the another polarized light flux and emit the one polarized light flux.

3. A laser processing method which emits a laser light with a light condensing point set inside of a workpiece to form modified regions inside of the workpiece along a planned cutting line of the workpiece, the laser processing method comprising:
    a modulation step of modulating the laser light emitted from a laser light source;
    a light condensing step of condensing the laser light modulated by a spatial light modulator, inside of the workpiece by a condenser lens;
    a relative moving step of moving the laser light relatively to the workpiece along the planned cutting line;
    a control step of performing control so that the laser light is condensed by the condenser lens at two positions which are different from each other in a thickness direction of the workpiece inside of the workpiece and are the same as each other in a relative movement direction of the laser light, to form the modified regions; and
    a light flux separating and combining step of polarizing and separating the laser light emitted from the laser light source into two polarized light fluxes having polarization directions orthogonal to each other to emit the two polarized light fluxes toward different regions of the spatial light modulator in a state where the two light fluxes have polarization directions matching each other, and combining the two polarized light fluxes modulated by the spatial light modulator to emit the combined light fluxes toward the condenser lens, wherein
    in the control step, hologram patterns to be presented by the spatial light modulator is controlled for respective regions of the spatial light modulator toward which the two polarized light fluxes are emitted, wherein
    the light flux separating and combining step further comprises an optical path length correction step of reducing a difference in geometric optical path length between the two polarized light fluxes.

4. The laser processing method according to claim 3, wherein
    the light flux separating and combining step comprises:
        a polarization separation step of polarizing and separating the laser light emitted from the laser light source into two polarized light fluxes having polarization directions orthogonal to each other;
        a reflecting step of reflecting one polarized light flux of the two polarized light fluxes polarized and separated in the polarization separation step so as to have an optical path parallel to an optical path of another polarized light flux of the two polarized light fluxes;
        a conversion step of converting a polarization direction of the one polarized light flux reflected in the reflecting step into a polarization direction of the another polarized light flux; and
        an emitting step of emitting the one polarized light flux having the polarization direction converted in the converting step and the another polarized light flux toward the spatial light modulator.

5. The laser processing apparatus according to claim 1, wherein
the controller controls the hologram patterns so as to condense the laser light by the condenser lens at the two positions which are different from each other in the thickness direction of the workpiece inside of the workpiece and are the same as each other in the relative movement direction of the laser light, and form the modified regions.

6. The laser processing method according to claim 3, wherein,
in the control step, the hologram patterns are controlled so that the laser light is simultaneously condensed by the condenser lens at the two positions which are different from each other in the thickness direction of the workpiece inside of the workpiece and are the same as each other in the relative movement direction of the laser light, to form the modified regions, simultaneously.

7. A laser processing apparatus which emits a laser light with a light condensing point set inside of a workpiece to form modified regions inside of the workpiece along a planned cutting line of the workpiece, the laser processing apparatus comprising:
  a laser light source configured to emit the laser light;
  a spatial light modulator configured to modulate the laser light;
  a condenser lens configured to condense the laser light inside of the workpiece;
  a relative driver configured to move the laser light relatively to the workpiece along the planned cutting line;
  a light flux separating and combining device including a Kester prism configured to polarize and separate the laser light emitted from the laser light source into two polarized light fluxes having polarization directions orthogonal to each other and emit the two polarized light fluxes toward different regions of the spatial light modulator in a state where the two polarized light fluxes have polarization directions matching each other, and configured to combine the two polarized light fluxes modulated by the spatial light modulator and emit the combined light fluxes toward the condenser lens; and
  a controller configured to control hologram patterns to be presented by the spatial light modulator for respective regions of the spatial light modulator toward which the two polarized light fluxes are emitted so as to condense the laser light by the condenser lens at two positions which are different from each other in a thickness direction of the workpiece inside of the workpiece and are the same as each other in a relative movement direction of the laser light, and form the modified regions.

8. The laser processing apparatus according to claim 7, wherein
the controller controls the hologram patterns so as to condense the laser light by the condenser lens at the two positions which are different from each other in the thickness direction of the workpiece inside of the workpiece and are the same as each other in the relative movement direction of the laser light, and form the modified regions.

9. A laser processing method which emits a laser light with a light condensing point set inside of a workpiece to form modified regions inside of the workpiece along a planned cutting line of the workpiece, the laser processing method comprising:
  a modulation step of modulating the laser light emitted from a laser light source;
  a light condensing step of condensing the laser light modulated by a spatial light modulator, inside of the workpiece by a condenser lens;
  a relative moving step of moving the laser light relatively to the workpiece along the planned cutting line;
  a control step of performing control so that the laser light is condensed by the condenser lens at two positions which are different from each other in a thickness direction of the workpiece inside of the workpiece and are the same as each other in a relative movement direction of the laser light, to form the modified regions; and
  a light flux separating and combining step of polarizing and separating the laser light emitted from the laser light source into two polarized light fluxes having polarization directions orthogonal to each other to emit the two polarized light fluxes toward different regions of the spatial light modulator in a state where the two light fluxes have polarization directions matching each other, and combining the two polarized light fluxes modulated by the spatial light modulator to emit the combined light fluxes toward the condenser lens, by using a Kester prism, wherein
  in the control step, hologram patterns to be presented by the spatial light modulator is controlled for respective regions of the spatial light modulator toward which the two polarized light fluxes are emitted.

10. The laser processing method according to claim 9, wherein,
in the control step, the hologram patterns are controlled so that the laser light is simultaneously condensed by the condenser lens at the two positions which are different from each other in the thickness direction of the workpiece inside of the workpiece and are the same as each other in the relative movement direction of the laser light, to form the modified regions, simultaneously.

\* \* \* \* \*